United States Patent
Acciai et al.

[11] Patent Number: 5,873,162
[45] Date of Patent: Feb. 23, 1999

[54] TECHNIQUE FOR ATTACHING A STIFFENER TO A FLEXIBLE SUBSTRATE

[75] Inventors: Michael Acciai, Newark Valley; Richard Ronald Hall, Endwell; Robert Nicholas Ives, Guilford, all of N.Y.

[73] Assignee: International Business Machines Corporation, Armonk, N.Y.

[21] Appl. No.: 799,752

[22] Filed: Feb. 11, 1997

[51] Int. Cl.⁶ .............................. H05K 3/02; H05K 3/10
[52] U.S. Cl. .............................................. 29/846; 29/840
[58] Field of Search .............................. 29/741, 743, 840, 29/841, 846; 437/211

[56] References Cited

U.S. PATENT DOCUMENTS

| | | | |
|---|---|---|---|
| 3,557,983 | 1/1971 | Hayes ........................................ | 29/846 X |
| 4,893,403 | 1/1990 | Heflinger et al. ......................... | 29/840 |
| 4,989,139 | 1/1991 | Friedman et al. ........................ | 364/200 |
| 4,994,986 | 2/1991 | Cihiwsky et al. ........................ | 364/519 |
| 5,249,343 | 10/1993 | Grosso et al. ........................... | 29/743 X |
| 5,357,672 | 10/1994 | Newman .................................. | 29/830 |
| 5,386,341 | 1/1995 | Olson et al. .............................. | 361/749 |
| 5,397,921 | 3/1995 | Karnezos .................................. | 257/779 |
| 5,409,865 | 4/1995 | Karnezos .................................. | 437/210 |
| 5,525,834 | 6/1996 | Fischer et al. ........................... | 257/691 |
| 5,546,654 | 8/1996 | Wojnarowski et al. ................... | 29/841 |
| 5,557,843 | 9/1996 | McKenney et al. ...................... | 29/851 |
| 5,600,881 | 2/1997 | Wanha ..................................... | 29/741 |
| 5,663,106 | 9/1997 | Karavakis et al. ....................... | 29/841 |

FOREIGN PATENT DOCUMENTS 6-45765  7/1992  Japan ....................................... 29/846

*Primary Examiner*—Peter Vo
*Assistant Examiner*—Rick Kiltae Chang
*Attorney, Agent, or Firm*—Douglas M. Clarkson

[57] ABSTRACT

The technique involves attaching a stiffener to a flexible substrate that has solder balls on the substrate. The steps include locating the flexible substrate on the stiffener with the solder balls on the side away from the stiffener, and drawing a vacuum to hold the flexible substrate in place. Locating the stiffener on a support with a pressure sensitive adhesive on a surface facing away from the support, and drawing a vacuum to hold the stiffener in place. Then, applying a pressure around the solder balls against the flexible substrate in the order of 2000 pounds per square inch to force the flexible substrate against the stiffener.

5 Claims, 5 Drawing Sheets

TECHNIQUE FOR ATTACHING A STIFFENER TO A FLEXIBLE SUBSTRATE

BACKGROUND OF THE INVENTION

1. Field of the Invention

The present invention, generally, relates to methods of making printed circuit board assemblies using flexible substrates and, more particularly, to a new and improved technique for attaching such flexible substrates to more rigid stiffeners.

Today, as the number of circuits increase so dramatically on a board or substrate, presently existing standards for electrical performance must be maintained, at the very least, to provide both consumer confidence and an increased competitive advantage. A step in this direction has been taken already in the development of the Ball Grid Array for integrated circuit packages, which now is taken to another height by the use of flexible substrates.

The ball grid array packages permit substantial increases in the number of circuit connections per unit area, but now, increases in the power involved have produced heat dissipation problems that are quite real and difficult to solve. Expected solutions require increases in cost, particularly if failures in package performance due to cracks are to be avoided.

2. Description of the Prior Art

U.S. Pat. No. 5,525,834 to Fischer et al. describes a package construction that separates voltage, signal and power leads into different conductive and dielectric layers.

U.S. Pat. No. 5,409,865 to Karnexos describes a package assembling process using a tape automated bonding technique to provide a flexible dielectric film for an area array of pads.

U.S. Pat. No. 5,397,921 to Karnexos describes a grid array tape and a semiconductor are attached to a stiffener by bonding agents to obtain mechanical rigidity.

U.S. Pat. No. 5,386,341 to Olson et al. describes an assembly of a circuit component to a flexible substrate with a rigidizer plate using a low modulus adhesive.

OBJECTS AND SUMMARY OF THE INVENTION

It is an object of the present invention to provide a technique for attaching a stiffener to a flexible substrate without disturbing solder balls on a surface of the substrate.

Another object of the present invention is to provide a technique for attaching a stiffener to a flexible substrate whereby a degree of control is available for developed temperature.

Briefly, the technique of the present invention involves attaching a stiffener to a flexible substrate that has solder balls on the substrate. The steps include supporting the stiffener on a support with a pressure sensitive adhesive on a surface facing away from the support, and drawing a vacuum to hold the stiffener in place. Locating the flexible substrate on the stiffener with the solder balls on the side away from the stiffener, and drawing a vacuum to hold the flexible substrate on the stiffener. Then, applying a pressure around the solder balls against the flexible substrate in the order of 2000 pounds per square inch to force the flexible substrate against the stiffener.

Other objects, features and advantages of the present invention will become more readily apparent from the following detailed description taken in conjunction with the accompanying drawings, a brief description of which follows.

DETAILED DESCRIPTION OF THE INVENTION

Figure 1:
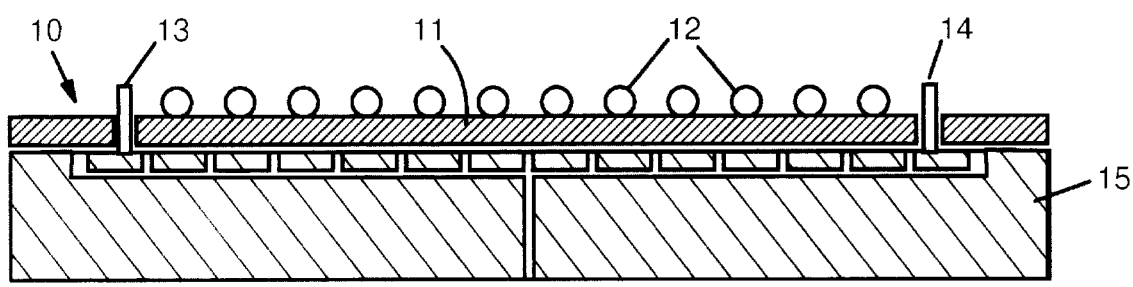
FIG. 1 is a view in cross section of an elongated flexible tape having solder balls to be assembled with a stiffener in accordance with the present invention.

Referring first to FIG. 1 of the drawings, an elongated flexible tape 10 has formed on the upper surface 11, as viewed in this figure, a plurality of solder balls 12 attached customarily to lands of a circuit, not visible. Location pins 13 and 14, that extend from a carrier 15, are used to locate the flexible tape 10 and solder balls 12 accurately, which will be understood better as the description proceeds.

More specifically, the elongated flexible tape 10 has a circuit with a predetermined purpose and arrangement of component parts that are not to be disturbed or damaged by the attaching of a stiffener. Such an elongated flexible tape 10 will have solder balls already attached to land patterns on the tape, but it is important that these solder balls not be moved, deformed of disturbed during the attaching of the stiffener.

To locate the flexible tape 10 and to hold it in the position determined by the pins 13 and 14, a vacuum is drawn on a chamber 15 which is applied all across the under side of the flexible tape 10. More specific details are not given in this description because the structure can be varied any number of ways, and this particular and specific structure is not important to the present invention, which includes the results.

Figure 2:
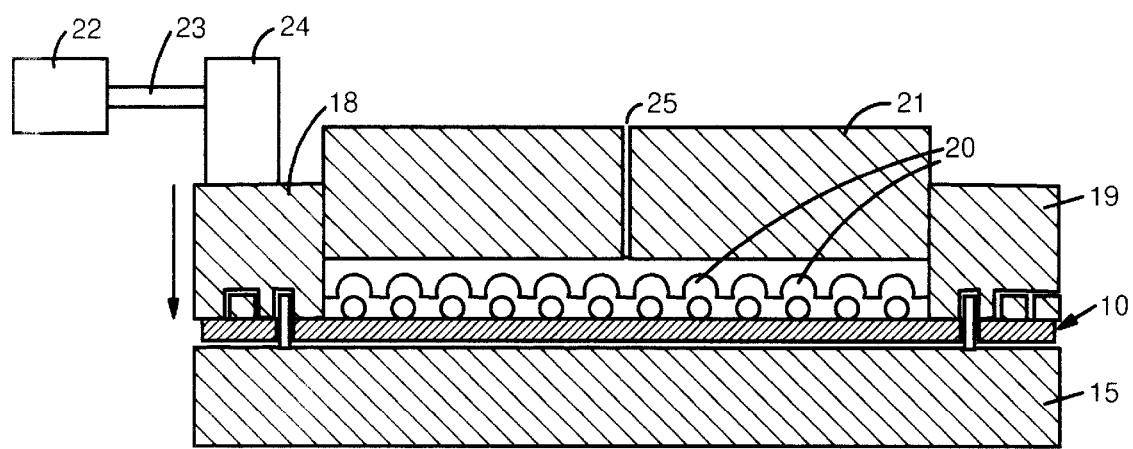
FIG. 2 is an illustration of a way to position the tape for pick up without damage to the solder balls.

Now, in FIG. 2, some intermediate steps are illustrated, which include lowering side members 18 and 19 to engage the upper surface of the flexible tape 10 while a punch assembly 21 is lowered. Recesses 20 that match each solder ball in location cover, without touching, each solder ball as a punch assembly 21 is lowered.

As stated hereinabove, there are several variations that can be made in the structure to accomplish the purpose of the present invention.

For example, a motor 22 connected through a drive shaft 23 to a cam 24 can move the side members 18 and 19 as described, as well as the punch assembly 21, but since a specific arrangement of these features is beyond the scope of the present invention, further details will not be described.

With the punch assembly 21 all the way down in contact with the surface of the flexible tape 10, the vacuum is released in the chamber beneath the flexible tape 10. Next, according to the technique of the present invention, a vacuum is drawn through the punch assembly 21, for example, through an opening 25, the space around each solder ball 12 and against the upper surface of the flexible tape 10.

Figure 3:
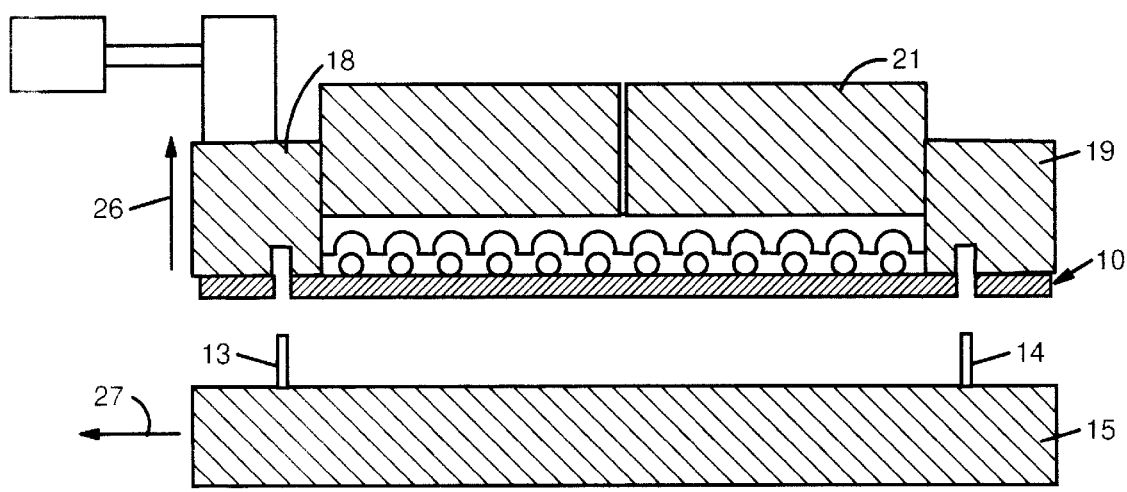
FIG. 3 illustrates a step in carrying out the invention by locating parts relative to each other.

FIG. 3 illustrates that at this point in the technique of the present invention, the punch assembly 21 is raised, along with the flexible tape 10 which is held firmly by the vacuum on the upper surface of the tape. The side members 18 and 19, are raised at the same time out of engagement with the locating pins 13 and 14.

An arrow 26 in this figure indicates the raising of the punch assembly 21, and an arrow 27 indicates that the carrier 15 now is withdrawn out of the way. To cut a flexible substrate from this flexible tape, with the circuit and the solder balls already on the substrate, refer to FIG. 4A of the drawings.

Figure 4A:
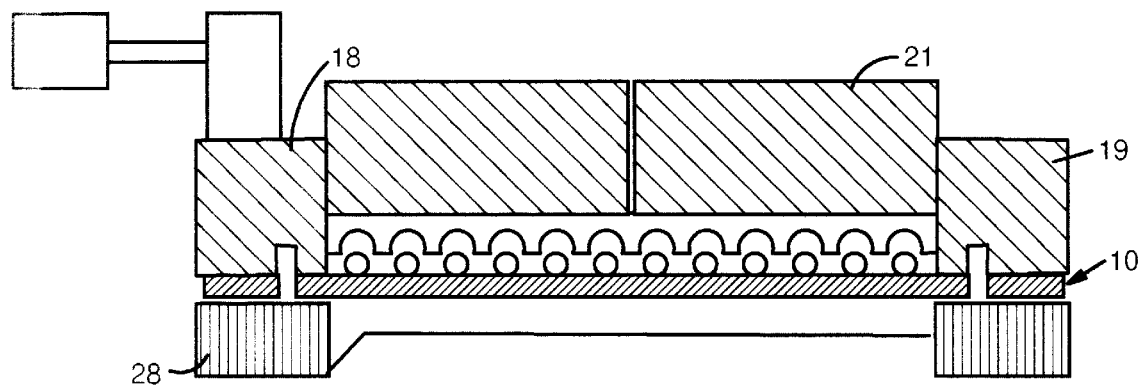
FIG. 4A illustrates a step of locating a tape with the solder balls for cutting a flexible substrate out of the tape.
Figure 4B:
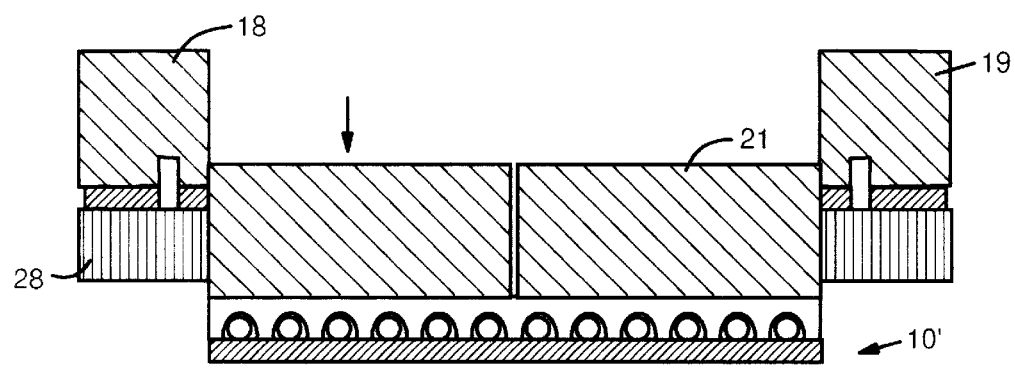
FIG. 4B illustrates a step of removing a flexible substrate from the elongated flexible tape with solder balls intact.

In FIG. 4A, a sizing die 28 is located relative to the flexible tape 10, with the circuit and solder balls as described above, so that by a single movement of the punch assembly 21, as illustrated by FIG. 4B, a flexible substrate 10' is formed. During this action, the vacuum is maintained between the upper surface of the flexible tape 10, the space around the solder balls and the punch assembly 21 to keep the flexible substrate in its location.

The steps described hereinabove are effective to produce the flexible substrate, circuit and solder balls, ready for attaching a stiffener. Before proceeding with the description, note that at no time is a force applied that could affect the solder balls, their shape or their location, all of which is due to the recesses around each solder ball.

Figure 5:
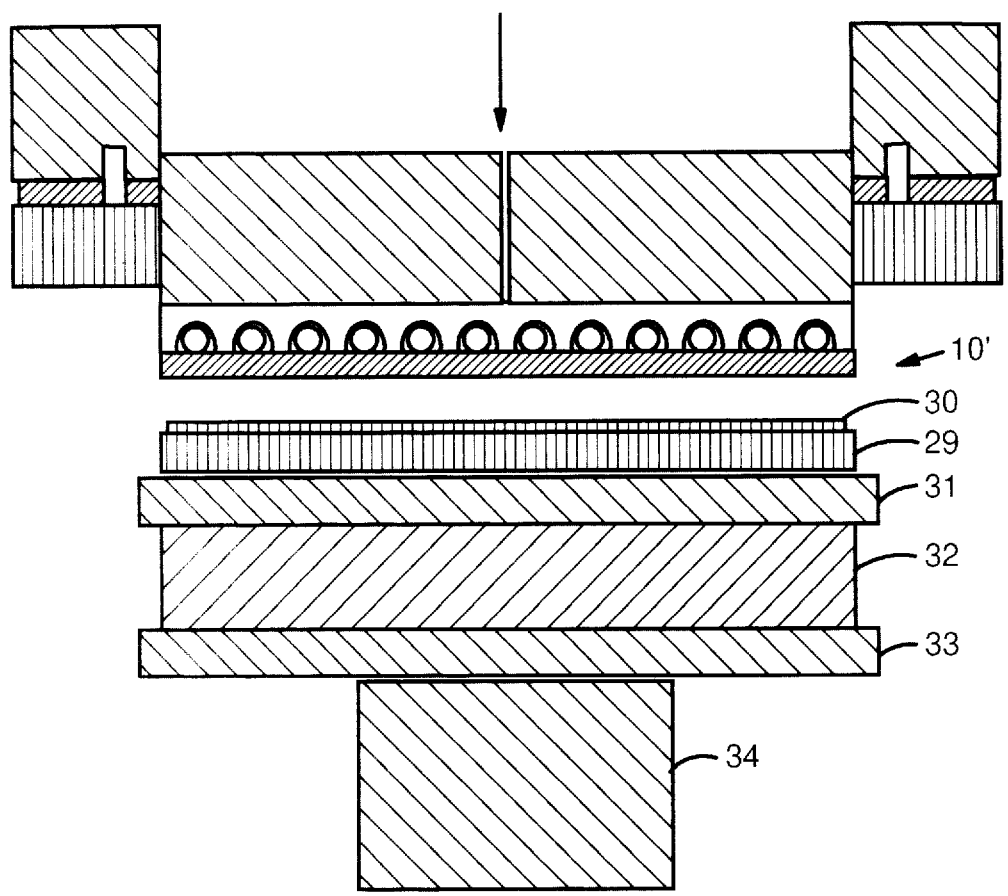
FIG. 5 is an illustration of a step of attaching a stiffener to the completed flexible substrate with solder balls.

As illustrated in FIG. 5 of the drawings, with the flexible substrate, solder balls, punch assembly and with vacuum still in place around the solder balls, the sizing die 28 is removed. It should be noted also that this description refers to relative positions between the tool structure and the flexible substrate with vacuum applied.

For example, by the expression "relative positions" is meant that the above description identifies the punch assembly as moving only vertically, with other components set and removed from beneath the punch assembly. Clearly, this structure can be modified so that the punch assembly can be moved from station to station while performing the technique of the present invention.

Returning now to a description of the invention, with the sizing die removed, a stiffener 29 is moved into the location relative to the flexible substrate 10' illustrated in this view of the drawings. In accordance with the present invention, the stiffener 29 includes a pressure sensitive adhesive 30 on the surface facing the flexible substrate 10'.

It has been found to be advisable in some instances to provide the additional support 31 with a compliant block 32 formed of a silicone rubber composition that serves to even out the backup force provided by the additional support 31. In still further instances, it can be a real advantage to the success of the technique of the present invention to have more support 33 beneath the compliant block 32.

With the arrangement of the component parts as described and with the punch assembly 21 providing a firm resistance against any upward movement of the flexible substrate 10', a ram 34 provides an upward force to move the stiffener 29 firmly against the face of the flexible substrate 10' opposite the face with the solder balls, so that the pressure sensitive adhesive 30' will attach the stiffener 29 to the flexible substrate 10'.

It has been found that an acceptable control over the operation of the component parts is obtained when the ram 34 moves upwardly, as viewed in FIG. 5, when about 300 pounds per square inch is applied. However, after the stiffener 29 is in engagement with the flexible substrate 10', this force is increased to about 2000 pounds per square inch, and it should be maintained for a period of time.

It has been found that an acceptable period of time is in the order of five (5) seconds. This period gives the adhesive material sufficient time to set and adhere effectively.

While there can be important instances where the primary purpose of the stiffener 29 is support for the substrate 10', it is a significant purpose to provide heat dissipation for the high temperature developed in today's flexible substrates. To this end, it is preferred that the material from which the stiffener 29 is formed has good heat conductivity characteristics.

It will be understood also that this description concerns component parts that are very thin, and since the term "thin" is a relative expression, it is intended to identify thickness as it exists in today's technology. Tomorrow, this thin thickness can be considered unreasonably thick, old fashioned and unacceptable.

Accordingly, since today's technology identifies a flexible substrate as being in the order of 0.004 inch. Nevertheless, regardless of just how "thin" or how "thick" a substrate is defined as being, the technique of the present invention is applicable.

Since a flexible substrate in today's technology is very thin, additional support can well be indicated. Therefore, the stiffener that is identified by the numeral 29 might well be attached more effectively using an additional support 31.

The present invention, described in detail hereinabove, includes the technique and/or method by which the advantages that it provides are available, and it is subject to variations and modifications that will occur to one skilled in this art. The detailed description of the presently preferred embodiment that is given above is not intended to be limiting, however.

Accordingly, the scope of the present invention is intended to be defined by the following claims.

What is claimed is:

1. A technique for attaching substantially rigid stiffener means to a flexible substrate having solder balls, comprising:

supporting said flexible substrate, by support means;

drawing a vacuum to hold said flexible substrate on said support means;

locating said flexible substrate on said stiffener means having an adhesive surface and with said solder balls facing away from said stiffener means; and applying a pressure around said solder balls against said flexible substrate in the order of 2000 pounds per square inch to force said flexible substrate against said adhesive surface of said stiffener means.

2. The technique for attaching stiffener means to a flexible substrate as defined by claim 1 wherein using locating pins to position said stiffener means and said flexible substrate relative to each other in order to avoid moving, damaging or disturbing said solder balls.

3. The technique for attaching stiffener means to a flexible substrate as defined by claim 1 wherein said stiffener means is formed of a material having relatively good thermal conductivity characteristics.

4. The technique for attaching stiffener means to a flexible substrate as defined by claim 3 wherein said material having relatively good thermal conductivity characteristics is a metal.

5. The technique for attaching stiffener means to a flexible substrate as defined by claim 4 wherein said metal is copper.

* * * * *